United States Patent
Sundaram et al.

(10) Patent No.: US 8,909,849 B2
(45) Date of Patent: Dec. 9, 2014

(54) PIPELINE ARCHITECTURE FOR SCALABLE PERFORMANCE ON MEMORY

(75) Inventors: Rajesh Sundaram, Folsom, CA (US); Derchang Kau, Cupertino, CA (US); David J. Zimmerman, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 500 days.

(21) Appl. No.: 12/946,612

(22) Filed: Nov. 15, 2010

(65) Prior Publication Data

US 2012/0120722 A1    May 17, 2012

(51) Int. Cl.
G11C 13/00    (2006.01)
G11C 7/10    (2006.01)

(52) U.S. Cl.
CPC .......... *G11C 13/0004* (2013.01); *G11C 7/1039* (2013.01); *G06F 2213/0038* (2013.01); *G11C 13/0061* (2013.01); *G11C 13/0069* (2013.01)
USPC ......................................................... 711/103

(58) Field of Classification Search
USPC .................................. 711/167, 103; 713/400
See application file for complete search history.

(56) References Cited

U.S. PATENT DOCUMENTS

| | | | |
|---|---|---|---|
| 6,134,145 A * | 10/2000 | Wong | 365/185.22 |
| 6,392,462 B2 * | 5/2002 | Ebuchi et al. | 327/295 |
| 7,304,885 B2 * | 12/2007 | Cho et al. | 365/163 |
| 7,577,024 B2 | 8/2009 | Fackenthal et al. | |
| 7,787,291 B2 * | 8/2010 | Resta et al. | 365/163 |
| 2004/0027908 A1 | 2/2004 | Ooishi et al. | |
| 2006/0200694 A1 * | 9/2006 | Rifani et al. | 713/400 |
| 2006/0291272 A1 | 12/2006 | Lowrey et al. | |
| 2008/0291719 A1 | 11/2008 | Fackenthal et al. | |
| 2010/0165719 A1 * | 7/2010 | Pellizzer | 365/163 |

FOREIGN PATENT DOCUMENTS

KR    1020090012576    2/2009

OTHER PUBLICATIONS

International Preliminary Report on Patent Ability for International Patent Application No. PCT/US2011/059529 mailed May 30, 2013, 6 pgs.

International Search Report and Written Opinion for International Patent Application No. PCT/US2011/059529 mailed May 17, 2012, 7 pgs.

Notice of Preliminary Rejection for Korean Patent Application No. 10-2013-701532 mailed Aug. 29, 2014, 7 pages.

\* cited by examiner

*Primary Examiner* — April Y Blair
*Assistant Examiner* — Trang Ta
(74) *Attorney, Agent, or Firm* — Blakely, Sokoloff, Taylor & Zafman LLP

(57) ABSTRACT

An apparatus for data storage is presented. In one embodiment, the apparatus includes a phase change memory device comprising phase change memory storage elements. The apparatus further includes control logic to control two or more set pipelines to serve memory requests in a staggered manner, such that set operations of the memory requests begin at different times.

20 Claims, 6 Drawing Sheets

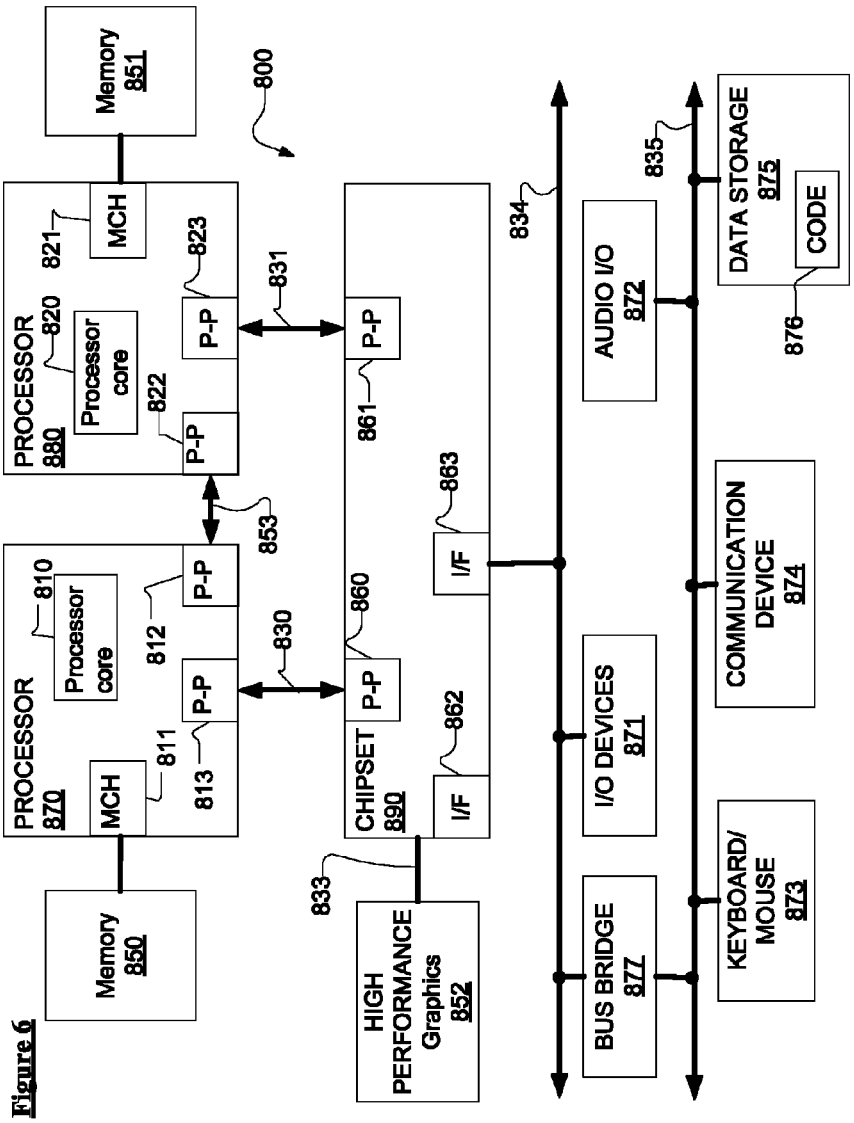

US 8,909,849 B2

PIPELINE ARCHITECTURE FOR SCALABLE PERFORMANCE ON MEMORY

FIELD OF THE INVENTION

Embodiments of the invention relate to data storage in computer systems; more particularly, embodiments of the invention relate to semiconductor memories.

BACKGROUND OF THE INVENTION

A phase change memory (PCM) is a device which uses chalcogenide material as a memory element. A memory element is the element that stores information. A phase change memory stores information on a memory element by changing the phase of the element between amorphous and crystalline phases. Generally, the amorphous phase is associated with what is called a reset state and the crystalline state is associated with what is called a set state. Multilevel memories may have a number of states intermediate between set and reset states.

In the programming operation, a phase change memory may be transitioned through the application of bias voltages and resulting currents to transition from amorphous to crystalline states or from crystalline to amorphous states.

In some phase change memories, an ovonic threshold switch (OTS) is used as the select device. An integrated memory storage element (cell) of a PCM and an ovanic threshold switch is known as a PCMS. A high amount of power is generally used to write a PCMS. This power requirement limits the array bandwidth of a memory to, for example, 10-25 MByte/s.

BRIEF DESCRIPTION OF THE DRAWINGS

Embodiments of the present invention will be understood more fully from the detailed description given below and from the accompanying drawings of various embodiments of the invention, which, however, should not be taken to limit the invention to the specific embodiments, but are for explanation and understanding only.

FIG. 6 illustrates a point-to-point computer system for use with one embodiment of the invention.

DETAILED DESCRIPTION OF THE INVENTION

Figure 1:
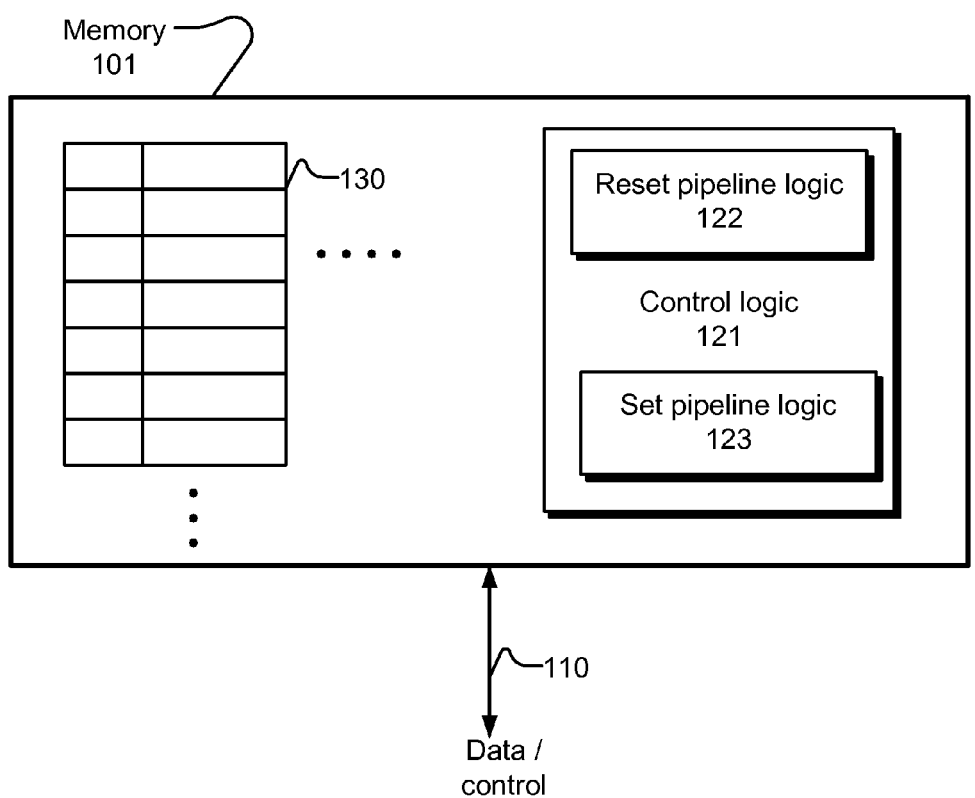
FIG. 1 is a block diagram of a memory device in accordance with one embodiment of the invention.

An apparatus for data storage is presented. In one embodiment, the apparatus includes a phase change memory device comprising phase change memory storage elements. The apparatus further includes control logic to control two or more set pipelines to serve memory requests (e.g., read or write requests) in a staggered manner, such that set operations of the memory requests begin at different times.

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of present invention also relate to apparatuses for performing the operations herein. Some apparatuses may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, DVD-ROMs, and magnetic-optical disks, read-only memories (ROMs), random access memories (RAMs), EPROMs, EEPROMs, NVRAMs, magnetic or optical cards, or any type of media suitable for storing electronic instructions, and each coupled to a computer system bus.

The method and apparatus described herein are for controlling a memory device for data storage. Specifically, the method and apparatus controlling a memory device are primarily discussed in reference to multi-core processor computer systems. However, the method and apparatus controlling a memory device are not so limited, as they may be implemented on or in association with any integrated circuit device or system, such as cell phones, personal digital assistants, embedded controllers, mobile platforms, desktop platforms, and server platforms, as well as in conjunction with other resources.

Overview

An apparatus for data storage is presented. In one embodiment, the apparatus includes a phase change memory device comprising phase change memory storage elements. The apparatus further includes control logic to control two or more set pipelines to serve memory requests in a staggered manner, such that set operations of the memory requests begin at different times. In one embodiment, the apparatus is operable as a non-volatile memory device, a volatile memory device (e.g., similar to DRAM or SRAM), or both.

FIG. 1 is a block diagram of a memory device in accordance with one embodiment of the invention. Many related components such as buses and peripherals have not been shown to avoid obscuring the invention. Referring to FIG. 1, memory device 101 comprises control logic 121 and memory elements 130. In one embodiment, control logic 121 further includes reset pipeline logic 122 to control one or more reset pipelines. In one embodiment, control logic 121 further includes set pipeline logic 123 to control one or more set pipelines. In one embodiment, memory device 101 receives memory requests via data/control 110.

In one embodiment, memory device 101 is a PCMS memory device. In one embodiment, memory elements 130 includes storage element, such as, for example, a PCMS storage element, a PCM storage element, an ovonic unified memory (OUM) element, a stackable PCM storage element, a storage element with a current profile similar to a PCMS storage element, or any combinations thereof. In one embodiment, a PCMS storage element includes a series-coupled ovonic threshold switch and chalcogenide memory element.

In one embodiment, reset pipeline logic 122 manages and controls two reset pipelines. Set pipeline logic 123 manages and controls ten groups of set pipelines, where each group includes four set pipelines. It will be appreciated by those skilled in the art that these configurations (e.g., the number of pipelines) may be scaled up or down while maintaining approximately the same functions.

In one embodiment, memory device 101 includes a pulse signal generating module or a pulse generating unit (not shown) to generate a pulse signal oscillating between high and low voltage levels. In one embodiment, a PCM storage element is crystallized by changing an operating current. It will be appreciated by those skilled in the art that there are different current profiles to generate a pulse signal in order to set or to reset a PCM storage element. In one embodiment, memory device 101 includes analog/digital logic, such as, for example, a pulse signal generating logic, bit select switches, charge/discharge circuit to perform writing operations.

In one embodiment, the aforementioned units are shown as discrete components. Other embodiments are possible where some or all of these units are integrated within a device or within other components. In other embodiments, the aforementioned units are distributed throughout a system in hardware, software, or some combination thereof.

Operations of control logic 121, reset pipeline logic 122, set pipeline logic 123 will be described in further detail below with additional references to the remaining figures.

Figure 2:
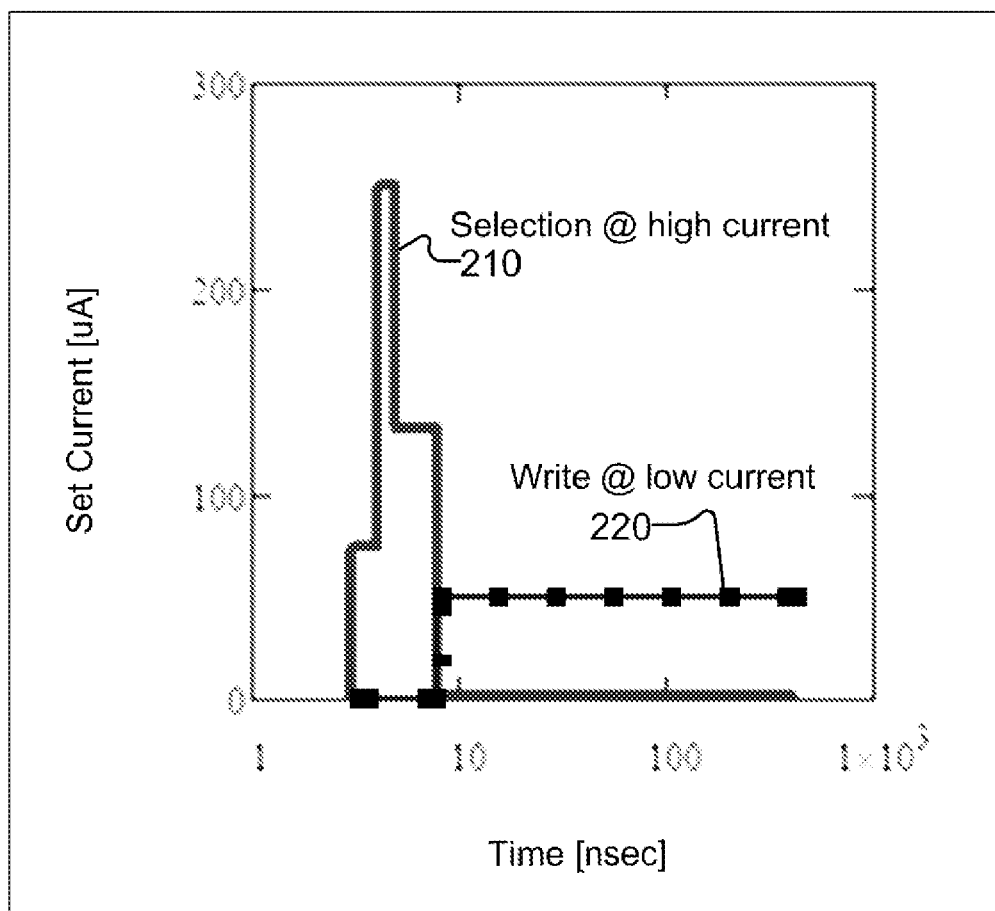
FIG. 2 is shows a current consumption profile in accordance with one embodiment of the invention.

FIG. 2 is shows a current consumption profile in accordance with one embodiment of the invention. The PCMS array consumes non-constant current during a write operation comprising selection and actual write. In one embodiment, the selection consumes, for example, 100 times more power than actual write. The selection, however, uses less than 5% of the overall time. Referring to FIG. 2, in one embodiment, a PCMS storage element consumes non-constant current between selection and actual write. The high current (210) is over 200 uA for a short period of time during selection. The low current (220) is about 50 uA for a longer period during the actual write.

In one embodiment, staggering the selection of storage elements spreads out the consumption of high current is able to reduce peak power in overall while accessing multiple storage elements. In one embodiment, a memory controller (e.g., control logic 121 with respect to FIG. 1) staggers the selection phase and uses a number of pipelines for the actual write (which takes longer to perform) to achieve a better power-bandwidth solution.

PCMS Operations

Figure 3:
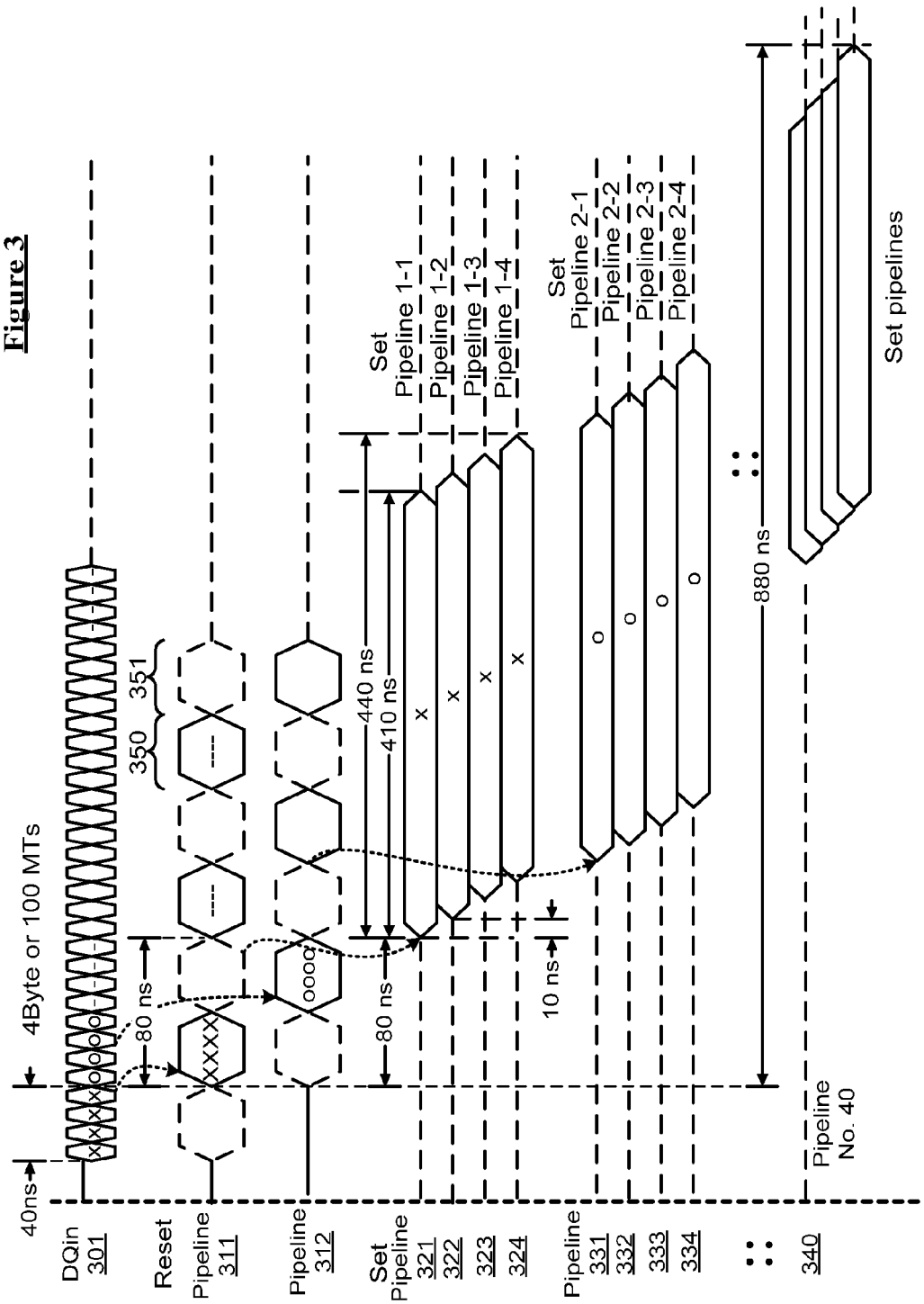
FIG. 3 is a waveform diagram for a memory write in accordance with one embodiment of the invention.

FIG. 3 is a waveform diagram for a memory write in accordance with one embodiment of the invention. Referring to FIG. 3, in one embodiment, a memory device includes signals, such as, for example, DQin 301, reset pipelines 311-312, set pipelines 321-324, set pipelines 331-334, and other set pipelines. In one embodiment, for instance, the memory device includes two reset pipelines and forty set pipelines. The set pipelines are grouped into four each (e.g., set pipelines 321-324).

In one embodiment, programming a PCMS storage element includes a reset operation followed by a set operation with respect to the PCMS storage element. A set (write) operation further includes selection and actual write.

In one embodiment, a memory device includes a memory controller (e.g., control logic 121 with respect to FIG. 1) to perform memory writes in conjunction with a staggered scheme. The architecture is scalable to a desired performance at optimized power.

In one embodiment, a memory device receives incoming data from DQin 301 (e.g., at the rate of 100 MT/s). The memory device is operable to take in batches of 4 Bytes with respect to reset operations and subsequently to process in batches of 40 Bytes with respect to set operations. The first 4 bytes from DQin 301 are indicated with "x", whereas, a subsequent 4 bytes are indicated with "o" (referring to FIG. 3).

In one embodiment, a reset operation uses two reset periods. For example, a reset operation for the first four-byte data from DQin 301 begins at reset pipeline 311. The reset operation for the second four-byte data from DQin 301 begins at reset pipeline 312 at 40 ns after the start time of the first four-byte data at reset pipeline 311. In one embodiment, a reset operation for the third four-byte data begins at reset pipeline 311, about 40 ns after the second four-byte data begin at reset pipeline 312.

In one embodiment, a reset operation for a subsequent four-byte data begins at 40 ns after a previous four-byte data (in a staggered manner). In one embodiment, the difference between start times of two consecutive reset operations is referred to herein as a reset staggered period (time duration). In one embodiment, a reset staggered period is 40 ns.

In one embodiment, a set operation uses about 410 ns of a set pipeline. For example, the first four-byte data from DQin 301 begins at reset pipeline 311 subsequently proceeds to a set operation (at set pipeline 321) after 80 ns (two reset periods) from the start time of the reset operation. The four-byte data are processed in a staggered manner (when performing the set operations) to reduce or to prevent an overlap between two subsequent selections. In one embodiment, four set pipelines (e.g., set pipelines 321-324) are used. Each set pipeline is staggered apart 10 ns. In one embodiment, the different between start times of two (consecutive) set operations is referred to herein as a set staggered period. In one embodiment, a set staggered period is about 10 ns.

In one embodiment, the second four-byte data (from reset pipeline 312) are processed in conjunction with set pipelines 331-334. In a similar manner, each pipeline is staggered apart for at least a set staggered period (e.g., 10 ns). In one embodiment, for example, the $40^{th}$ byte from DQin 301 is performed in set pipeline 340 (the $40^{th}$ set pipeline) and its corresponding set duration ends at 880 ns from the time the first four-byte data arrives at reset pipeline 311.

It will be appreciated by those skilled in the art that the duration of a set staggered period and the duration of a reset staggered period may be increased or decreased for different pipelines. In one embodiment, the values are determined in conjunction with a profile, an operating system, a user configuration setting, a sampling result, or combinations thereof.

In one embodiment, for example, 95% of all reset operations complete in a first reset period (e.g., period 350) which is 40 ns. Period 350 comprises two pulses. The remaining 5% of reset operations completes in the second reset period (e.g., period 351) which includes two additional pulses. In one embodiment, a staggered re-pulse for write completion is performed. Multiple reset pulses are processed on current data while a set pulse is being processed on previous data. The completion of a reset operation is increased from a nominal 95% (typically achieved through 2 pulses) to 100% by using 2-6 additional pulses (at 5% additional power with minor latency impact).

In one embodiment, by scaling the parallelism in performing reset and set operations, a higher throughput becomes possible (e.g., at 200 MT/s/pin or 400 MT/s/pin). Table 1, for instance, shows an example of configuration in one embodiment.

TABLE 1

Scalable Architecture

| Per 100 MT/s | Parallelism (Byte) | Cycle Time | Core supply (High) | Core supply (Low) |
|---|---|---|---|---|
| Read | 1 B | 10 ns | 0.1 mA | 0.12 mA |
| Reset | 4 B | 80 ns | 0.44 mA | 1.94 mA |
| Set | 40 B | 440 ns | 1.02 mA | 8 mA |

In one embodiment, scalable memory architecture helps to achieve high bandwidth and low/fixed latencies at a high write bandwidth (e.g., 400 MByte per second) in conjunction with PCM/PCMS technology while at improved power consumption. Such architecture may allow memory bandwidth to scale to the levels of 10 bandwidths. Die buffers maybe eliminated if the memory bandwidth (array bandwidth) is equal to the interface bandwidth.

In one embodiment, the peak power is limited to within a value (e.g., 100 mW) as compared to 600 mW if without the staggering. This is important because the current is generally from on-die charge pumps which generate high voltages at a power efficiency of 10%.

In one embodiment, control logic is operable to control two or more set pipelines to serve memory accesses in a staggered manner, such that operations of the memory accesses begin at different times. A control logic is operable to determine which set pipelines and which reset pipelines (and how many) to be active in use based at least on a set period, a reset period, and a set staggered period. In one embodiment, the number of set pipelines is based in part on the set staggered period and the time to complete a set operation (a set period). The length of the set staggered period is based in part on a power profile of a phase change memory storage element or a non-constant current consumption profile of a phase change memory storage element.

In one embodiment, reset pipeline logic controls one or more reset pipelines. Set pipeline logic controls the two or more set pipelines to reduce peak power when performing the set operations.

In one embodiment, reset pipeline logic is operable to perform the first reset operation and a subsequent reset operation, such that the subsequent reset operation begins after the first reset operation has started for at least a reset staggered period. In one embodiment, the first reset operation starts at a the beginning of a first reset period and the subsequent reset operation starts at the beginning of another reset period which follows the first reset period. In one embodiment, the reset pipeline logic controls the subsequent reset operation to only begin after a reset staggered period (e.g., 40 ns) following the start time of a previous reset operation. In one embodiment, a reset operation completes in two reset periods which includes a first reset period and a second reset period. The second reset period is to perform re-pulse for write completion.

In one embodiment, start times of set operations are staggered apart from each other for at least a set staggered period. Set pipeline logic is operable to perform a first set operation and a subsequent set operation. The difference of start times for the first set operation and the subsequent set operation is the length of a set staggered period. In one embodiment, set pipeline logic is operable to arrange start times of set operations to reduce overlap among selection phases when performing the set operations. The set pipeline logic controls a subsequent set operation to begin after a set staggered period (e.g., 10 ns) following the start time of the previous set operation. The set pipeline logic schedules when to start each of the set operations to reduce the overlap of selection phases when performing the set operations.

Figure 4:
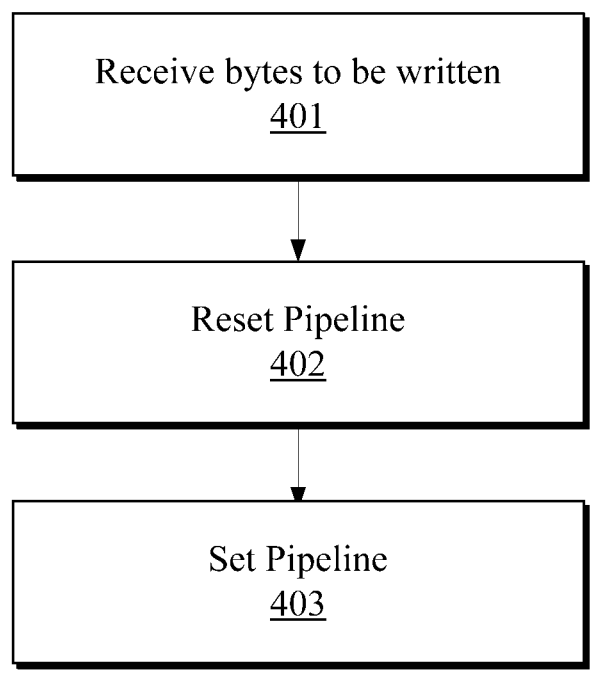
FIG. 4 is one embodiment of a process to write a PCMS memory device.

FIG. 4 is one embodiment of a process to write a PCMS memory device. The process is performed by processing logic that may comprise hardware (circuitry, dedicated logic, etc.), software (such as one that is run on a general purpose computer system or a dedicated machine), or a combination of both. In one embodiment, the process is performed in conjunction with a PCMS memory controller (e.g., control logic 121 with respect to FIG. 1).

Referring to FIG. 4, in one embodiment, processing logic begins by receiving memory requests. In one embodiment, processing logic receives several bytes to be written/programmed (process block 401).

In one embodiment, a write operation (or an operation to program a storage element) includes a reset operation followed by a set operation. Processing logic controls one or more reset pipelines to perform reset operations in a staggered manner (process block 402). For example, each reset operation is staggered from each other for at least a period of time referred to herein as a reset staggered period. In one embodiment, the reset staggered period is 40 ns.

In one embodiment, processing logic controls two or more set pipelines to perform (schedule) set operations in a staggered manner (process block 403). For instance, the start time of a set operation is staggered from start times of other set operations for at least a period of time referred to herein as a set staggered period. In one embodiment, a set staggered period is 10 ns.

Embodiments of the invention may be implemented in a variety of electronic devices and logic circuits. Furthermore, devices or circuits that include embodiments of the invention may be included within a variety of computer systems. Embodiments of the invention may also be included in other computer system topologies and architectures.

Figure 5:
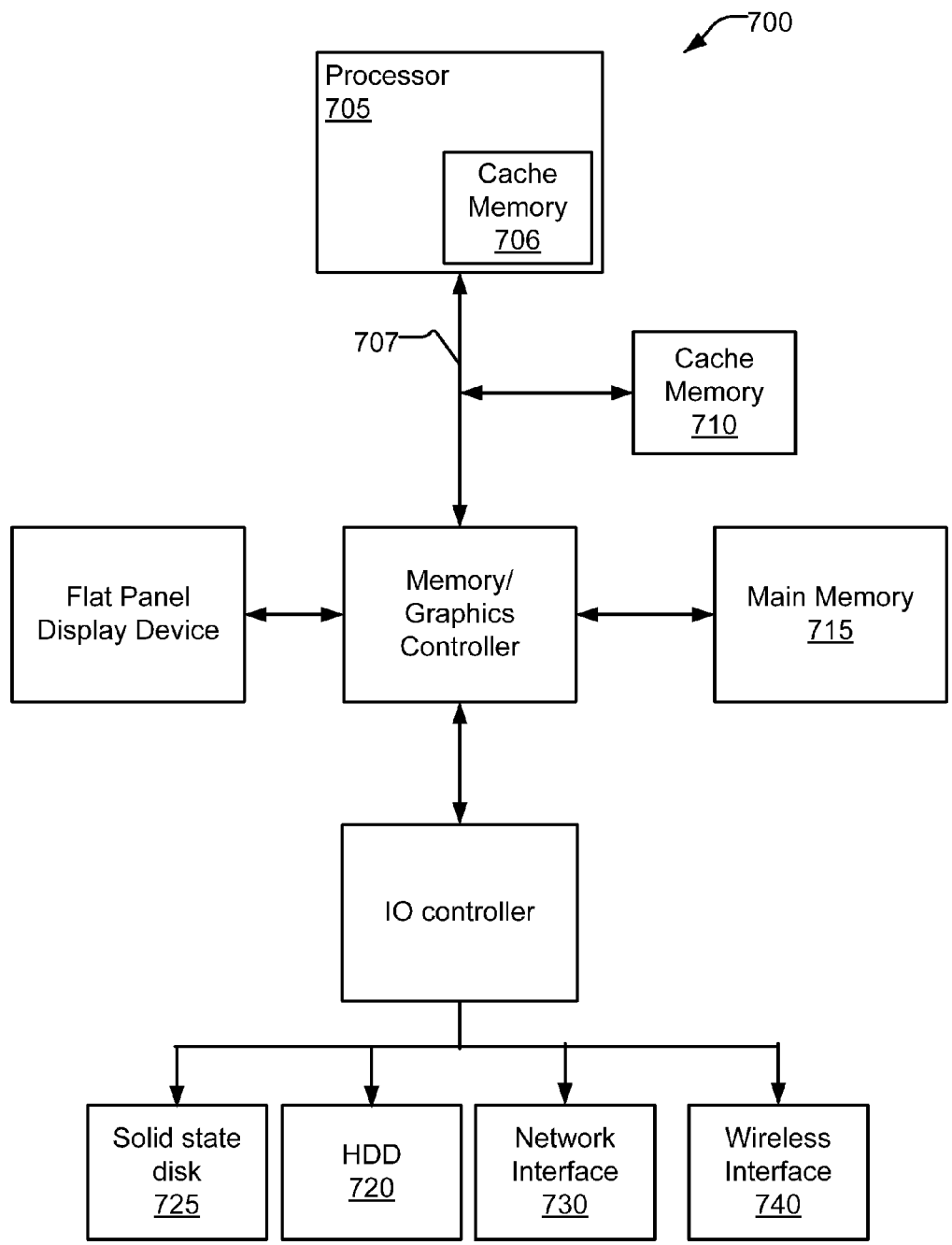
FIG. 5 illustrates a computer system for use with one embodiment of the present invention.

FIG. 5, for example, illustrates a computer system in conjunction with one embodiment of the invention. Processor 705 accesses data from level 1 (L1) cache memory 706, level 2 (L2) cache memory 710, and main memory 715. In other embodiments of the invention, cache memory 706 may be a multi-level cache memory comprise of an L1 cache together with other memory such as an L2 cache within a computer system memory hierarchy and cache memory 710 are the subsequent lower level cache memory such as an L3 cache or more multi-level cache. Furthermore, in other embodiments, the computer system may have cache memory 710 as a shared cache for more than one processor core.

Processor 705 may have any number of processing cores. Other embodiments of the invention, however, may be implemented within other devices within the system or distributed throughout the system in hardware, software, or some combination thereof.

Main memory 715 may be implemented in various memory sources, such as dynamic random-access memory (DRAM), hard disk drive (HDD) 720, solid state disk 725 based on NVRAM technology, a PCM memory, or a memory source located remotely from the computer system via network interface 730 or via wireless interface 740 containing various storage devices and technologies. The cache memory may be located either within the processor or in close proximity to the processor, such as on the processor's local bus 707. Furthermore, the cache memory may contain relatively fast memory cells, such as a six-transistor (6T) cell, or other memory cell of approximately equal or faster access speed.

Other embodiments of the invention, however, may exist in other circuits, logic units, or devices within the system of FIG. 5. Furthermore, other embodiments of the invention may be distributed throughout several circuits, logic units, or devices illustrated in FIG. 5.

Similarly, at least one embodiment may be implemented within a point-to-point computer system. FIG. 6, for example, illustrates a computer system that is arranged in a point-to-point (PtP) configuration. In particular, FIG. 6 shows a system where processors, memory, and input/output devices are interconnected by a number of point-to-point interfaces.

The system of FIG. 6 may also include several processors, of which only two, processors 870, 880 are shown for clarity. Processors 870, 880 may each include a local memory controller hub (MCH) 811, 821 to connect with memory 850, 851. Processors 870, 880 may exchange data via a point-to-point (PtP) interface 853 using PtP interface circuits 812, 822. Processors 870, 880 may each exchange data with a chipset 890 via individual PtP interfaces 830, 831 using point to point interface circuits 813, 823, 860, 861. Chipset 890 may also exchange data with a high-performance graphics circuit 852 via a high-performance graphics interface 862. Embodiments of the invention may be coupled to computer bus (834 or 835), or within chipset 890, or within data storage 875, or within memory 850 of FIG. 6.

Other embodiments of the invention, however, may exist in other circuits, logic units, or devices within the system of FIG. 6. Furthermore, other embodiments of the invention may be distributed throughout several circuits, logic units, or devices illustrated in FIG. 6.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chipset components, programmable logic arrays (PLA), memory chips, network chips, or the like. Moreover, it should be appreciated that exemplary sizes/models/values/ranges may have been given, although embodiments of the present invention are not limited to the same. As manufacturing techniques (e.g., photolithography) mature over time, it is expected that devices of smaller size could be manufactured.

Whereas many alterations and modifications of the embodiment of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. An apparatus comprising:
a phase change memory device comprising a plurality of phase change memory storage elements; and
control logic to control two or more set pipelines to serve memory accesses in a staggered manner, such that set operations of the memory accesses begin at different times, the control logic including
reset pipeline logic to control one or more reset pipelines, wherein the reset pipeline logic causes a reset staggered period to pass between reset operations; and
set pipeline logic distinct from the reset pipeline logic to control the two or more set pipelines to reduce peak power when performing the set operations, wherein the set pipeline logic causes a set staggered period to pass between set operations;
wherein the control logic is operable to determine which set pipelines and which reset pipelines and how many are to be in use based at least on a set period, a reset period, and a set staggered period, and wherein the reset staggered period is less than the set staggered period and an amount of data processed during a reset period is greater than an amount of data processed during a set period.

2. The apparatus of claim 1, wherein the memory accesses are write operations, wherein start times of the set operations are at least staggered apart from each other for a set staggered period.

3. The apparatus of claim 1, wherein a phase change memory storage element includes a series-coupled ovonic threshold switch and chalcogenide memory element.

4. The apparatus of claim 1, wherein the reset pipeline logic is operable to perform a first reset operation and a second reset operation, wherein the second reset operation begins after the first reset operation has started for at least a reset staggered period.

5. The apparatus of claim 4, wherein the first reset operation completes in two reset periods which includes a second reset period to perform re-pulse for write completion.

6. The apparatus of claim 1, wherein the reset pipeline logic is operable to perform a first reset operation and a second reset operation, wherein the first reset operation starts at a the beginning of a first reset period and the second reset operation starts at the beginning of a second reset period which follows the first reset period, wherein a first reset period is less than or equal to 40 ns in length.

7. The apparatus of claim 1, wherein the set pipeline logic is operable to perform a first set operation and a second set operation, wherein the difference of start times for the first set operation and the second set operation is the length of a set staggered period.

8. The apparatus of claim 7, wherein the number of set pipelines is 40, the first set operation is performed in a set period about 410 ns, and the set staggered period is equal to or less than 10 ns.

9. The apparatus of claim 7, wherein the number of set pipelines is based at least in part on the set staggered period and time to complete a set operation.

10. The apparatus of claim 7, wherein the length of the set staggered period is based at least in part on a power profile of a phase change memory storage element or a non-constant current consumption profile of a phase change memory storage element.

11. The apparatus of claim 1, wherein the set pipeline logic is operable to arrange start times of the set operations to reduce overlap among selection phases when performing the set operations.

12. The apparatus of claim 1, wherein the control logic is operable to determine which set pipelines and which reset pipelines to be active, based at least on a set period, a reset period, and a set staggered period.

13. A method comprising:
- receiving write requests to a phase change memory device; and
- serving memory writes in a staggered manner such that set operations begin at different times, wherein start times of the set operations are staggered apart from each other for at least a set staggered period, wherein serving the memory writes includes
  - controlling one or more reset pipelines with reset pipeline logic to cause a reset staggered period to pass between reset operations; and
  - controlling two or more set pipelines with set pipeline logic distinct from the reset pipeline logic, to reduce peak power when performing the set operations to cause a set staggered period to pass between set operations;
- wherein the control logic is operable to determine which set pipelines and which reset pipelines and how many are to be in use based at least on a set period, a reset period, and a set staggered period, and wherein the reset staggered period is less than the set staggered period and an amount of data processed during a reset period is greater than an amount of data processed during a set period.

14. The method of claim 13, further comprising:
- performing a first reset operation and a second reset operation; and
- controlling the second reset operation to begin after a reset staggered period following a start time of the first reset operation.

15. The method of claim 13, further comprising performing a first reset operation and a second reset operation, wherein the first reset operation starts at a the beginning of a first reset period and the second reset operation starts at the beginning of a second reset period which follows the first reset period.

16. The method of claim 13, further comprising:
- performing at least a first set operation and a second set operation; and
- controlling the second set operation to begin after the set staggered period following a start time of the first set operation.

17. The method of claim 13, further comprising scheduling when to start each of the set operations to reduce overlap among selection phases when performing the set operations.

18. A system comprising:
- a processing core;
- a phase change memory device; and
- control logic, coupled to the phase change memory device, to control two or more set pipelines to serve memory accesses in a staggered manner, such that set operations of the memory accesses begin at different times, the control logic including
  - reset pipeline logic to control one or more reset pipelines, wherein the reset pipeline logic causes a reset staggered period to pass between reset operations; and
  - set pipeline logic distinct from the reset pipeline logic to control the two or more set pipelines to reduce peak power when performing the set operations, wherein the set pipeline logic causes a set staggered period to pass between set operations;
- wherein the control logic is operable to determine which set pipelines and which reset pipelines and how many are to be in use based at least on a set period, a reset period, and a set staggered period, and wherein the reset staggered period is less than the set staggered period and an amount of data processed during a reset period is greater than an amount of data processed during a set period.

19. The system of claim 18, wherein the control logic comprises reset pipeline logic operable to perform a first reset operation and a second reset operation, wherein the second reset operation begins after the first reset operation has started for at least a reset staggered period.

20. The system of claim 18, wherein the control logic comprises set pipeline logic operable to perform at least a first set operation and a second set operation, wherein the difference between start times of the first set operation and the second set operation is at least the length of a set staggered period.

* * * * *